US006934017B2

(12) United States Patent
Kircher

(10) Patent No.: US 6,934,017 B2
(45) Date of Patent: Aug. 23, 2005

(54) METHOD AND DEVICE FOR DETECTION OF INFORMATION ON OPTICAL ELEMENTS, PARTICULARLY FOR MONITORING A LASER ARRANGEMENT

(75) Inventor: Steffen Kircher, Stuttgart (DE)

(73) Assignee: Trumpf Werkzeugmaschinen GmbH & Co. KG, Ditzingen (DE)

( * ) Notice: Subject to any disclaimer, the term of this patent is extended or adjusted under 35 U.S.C. 154(b) by 239 days.

(21) Appl. No.: 10/288,093

(22) Filed: Nov. 4, 2002

(65) Prior Publication Data

US 2003/0090256 A1 May 15, 2003

(30) Foreign Application Priority Data

Nov. 9, 2001 (EP) ........................................... 01126740

(51) Int. Cl.[7] .................................................. G01J 1/46

(52) U.S. Cl. ....................... 356/215; 356/213; 356/229; 702/39; 702/54

(58) Field of Search ................................ 356/215, 213, 356/229; 702/39, 54, 59; 219/121.81, 121.83

(56) References Cited

U.S. PATENT DOCUMENTS 4,692,623 A * 9/1987 Roberts et al. ............. 250/349
6,528,762 B2 * 3/2003 Mayer ................... 219/121.83
6,732,056 B2 * 5/2004 Kluft et al. ................... 702/39

FOREIGN PATENT DOCUMENTS

DE 196 36 249 A1 * 3/1998
DE 101 08 955 A1 * 10/2002
FR 2 698 495 A1 * 11/1992

* cited by examiner

*Primary Examiner*—Layla G. Lauchman

(57) ABSTRACT

A method for detection of information on at least one optical element for monitoring an equipment, in which an electromagnetic radiation is shaped or guided by the at least one optical element, particularly for monitoring a laser arrangement. A change of at least one physical quantity in or on at least one optical element is detected with a measuring device by means of the absorbed electromagnetic radiation. At least one actual value detected by means of the measuring device is forwarded to an evaluation unit. At least one actual value is compared with a reference value deposited in the evaluation unit.

22 Claims, 5 Drawing Sheets

METHOD AND DEVICE FOR DETECTION OF INFORMATION ON OPTICAL ELEMENTS, PARTICULARLY FOR MONITORING A LASER ARRANGEMENT

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

The invention relates to a method and device for detection of information on optical elements, particularly for monitoring a laser arrangement, which optical elements are used at least for the determination of a power of an electromagnetic radiation along a beam path and for the determination of a degree of contamination, or ageing, or the beginning of destruction of optical elements.

TECHNICAL FIELD

Laid-open German Patent Application DE 196 36 249 A1 discloses a device for protecting optical components. The aim of this patent application is to detect and prevent in good time a progressive destruction of optical elements, so that the partially destroyed surface of the components can in good time be polished and the reflecting coating can be newly removed or replaced, achieving a considerable cost saving compared to replacement with a new optical element.

To detect progressive destruction, perforated scattering plates are placed before and after the optical element, and scatter the laser beam when destruction of the optical component begins, with the scattered light arising due to destruction deflected by the scattering plates in the direction toward detectors. When a given scattered light cone is exceeded, a signal is emitted, by means of which the laser power supply unit of an oscillator is immediately switched off. This disadvantage of this arrangement is that additional components are required, which must be arranged in the beam path, in order to detect a possible beginning of destruction of the optical components. Such a device can only be inserted in a laser arrangement conditionally, because of the space required for mounting the components. Furthermore, the laser power cannot be monitored by this device.

A brochure entitled "Laserscope UFC 60" from the firm "Prometec" describes a device by means of which a continuous measurement and monitoring of unfocused laser radiation of high power lasers are made possible, which are primarily used in laser processing. The device operates on the measurement principle according to which the electrical resistance of a wire increases when its temperature increases due to absorbed radiation. For determining2 measurement data, plural superposed grids are provided, with extremely thin wires arranged adjacent to one another. For beam monitoring, a device is proposed with two superposed grids. This device receiving the grids is to be positioned in a beam path, so that the laser beam can pass through these grids.

Thus, this device can only be conditionally inserted into a laser arrangement, because of the housing receiving the grids. Furthermore, the wires provided for detecting information are extremely sensitive, since they have a diameter in the lower micrometer range and can break very easily. In particular, cooling of the grids for a precise measurement is possible only with difficulty, since the wires break still more easily in a strong air stream. However, due to the continuous heating up of the grids, the detected values are subject to error without cooling of the grids. Furthermore, dirt particles can lodge on the grids and additionally falsify the measurement results. Moreover, this device cannot be inserted into a laser equipment. Also, the contamination, aging or beginning destruction of optical elements cannot be detected.

SUMMARY OF THE INVENTION

The object of the invention is to provide a method and a device for detection of information on optical elements, particularly for monitoring and quality assurance of a laser arrangement, which make a simple and cost-effective detection of the power of electromagnetic radiation along a beam path possible, and the detection of a degree of contamination, beginning aging, or destruction of optical elements.

This object is attained according to the invention by a method for the detection of information on at least one optical element for monitoring an equipment, wherein an electromagnetic radiation from the at least one optical element is shaped or guided, particularly for monitoring a laser arrangement in which a change in or on at least one optical element of at least one physical quantity due to the absorbed electromagnetic radiation is detected with a measuring device; wherein at least one actual value detected by means of the measuring device is forwarded to an evaluation unit; and wherein the at least one actual value is compared with a reference value deposited in the evaluation unit. The object of the invention is also attained by a device for detecting information on at least one optical element for monitoring an equipment, wherein a measuring device has at least one contact element which can be arranged on at least one optical element, and wherein the measuring device transmits measurement signals to an evaluation unit.

The advantage of the method according to the invention is that the electromagnetic radiation absorbed in an optical element brings about a change of at least one physical quantity and is detected and used for process monitoring and quality assurance, particularly for a laser arrangement. Heat is produced by the electromagnetic radiation absorbed in an optical element. Thereby at least the temperature, for example, changes as a physical quantity in the optical element. By means of the measuring device, both the production of heat and also a secondary process occasioned thereby, for example a change in electrical conductivity, can be detected. Likewise, both or several changes can be detected by the measuring device. The change of at least one physical quantity thus serves as an information source, for example, for monitoring the power of the electromagnetic radiation and also for the detection of the degree of contamination or a beginning destruction or aging of the optical element. Individual or all optical elements, particularly in a laser arrangement, can be monitored for increased contamination, aging or beginning destruction by this method in a simple manner without installation of additional units or housings or other components having to be installed in the beam path of an electromagnetic beam. Likewise, for example during operation of a laser arrangement, monitoring the power of the electromagnetic radiation along the beam path from the place where it is produced to the place where it is used can take place, and a possible departure from the desired power can be detected, and a detection of faults can be performed.

Furthermore, the method according to the invention, when used in a laser arrangement, has the advantage that the information can be detected both on internal and also external optical elements of a laser arrangement. Internal optical elements include, for example, deflecting, reflecting, coupling-out, and partially transmitting mirrors, and transmitting optics, for example lenses that can be arranged in the laser equipment. The external optical elements include the beam-shaping and/or beam-guiding optics, for example deflecting or concave mirrors and focusing lenses. Furthermore, this method is performed independently of the laser power and can be performed for all optical elements.

Preferably the change of electrical conductivity is detected on or in the optical element by measurement of the electrical resistance with a measuring device. A simple detection of the secondary process can thereby take place based on the thermal change due to the absorption, and a precise evaluation can be given of the actual values detected by the measuring device in comparison with a reference value. It is taken into account here that the specific resistance of a material changes in dependence on temperature, and is reciprocally related to the electrical conductivity. The measured resistance depends on the specific resistance, so that by comparing the actual value with the reference value, a statement can be made about a possible deviation of the power of the electromagnetic radiation and also the performance or change of the optical element. Alternatively, a change of the voltage or of the current can be detected. Furthermore, a change of the capacitive resistance can be followed by the measurement. Likewise, further processes effected by relaxation and/or deactivation processes can be detected.

The reference value and respectively the actual value are detected on a support material of an optical element. Support materials for optical elements in a laser arrangement preferably use both metallic materials, for example copper or the like, and semiconductor materials, for example silicon or the like. All other materials or alloys whose electrical resistance changes with temperature, and which fulfill further requirements for use for electromagnetic radiation, are suitable.

Alternatively, it can be provided that the reference value and the actual value(s) are detected on a coating on the support material of the at least one optical element. With the use of optical elements, these mostly have metallic coatings, coatings consisting of semiconductor material, or dielectric layers. Plural layers of conductive, particularly electrically conductive, material, and non-conductive, particularly electrically non-conductive, material are preferably provided in superposition. The multilayer coating consists of, for example, zinc selenide as the insulator and germanium. Germanium has, for example, the property that its electrical resistance changes in dependence on temperature. Any further materials are likewise usable which have these or similar properties and are suitable as a coating, particularly in the use of a laser beam. Alternatively to an electrically conductive coating, a dielectric layer, for example of thorium tetrafluoride in combination with zinc selenide, can be provided for forming a multilayer coating. The structure of the multilayer coating can also be constituted differently from this. For example, high-ohmic and low-ohmic layers can be combined, directly superposed or also combined with one or more insulating layers. Likewise, more of less dielectric or electrically conductive layers can be combined, directly superposed or else with one or more insulating layers. Likewise, several measurement planes can be implemented in this manner. By means of all of the above-mentioned arrangements, the detection of the actual value can be performed on plural layers, so that a high resolution and better determination of the measurement values is made possible. The beam position of the electromagnetic radiation with respect to the optical element can also be determined thereby.

According to a further embodiment of the invention, it is provided that an actual value is detected, time-delayed from when the electromagnetic radiation first strikes the at least one optical element. It can thereby be ensured that the change of the physical quantity due to the absorbed radiation has taken place nearly completely, so that a quasi-constant value is detected. Thus, a further change of the physical quantity during the measurement can be excluded as a source of error.

According to an embodiment of the method, it is provided that before the initial operation or the mounting of the optical element in a laser arrangement, a reference value of the at least one optical element is determined. Thus a specific reference value can be allocated to each optical element, in order to obtain a precise statement about the magnitude of the changes due to the absorption, and to be able to detect and take into account the deviation of the actually present electrical resistance of the individual optical elements.

According to a further embodiment of the invention, it is provided that the change of the power of an electromagnetic radiation brings about a change of the physical quantity, preferably as the change of the electrical resistance, and when this exceeds or falls below an upper and a lower limiting value, which can be selected for the reference value, of a power of the electromagnetic beam, a signal is emitted from the evaluation unit for warning, readjustment or switching off the equipment, particularly the laser equipment. In this manner it can be ensured that damage to components due to rising power of the beam can be avoided. Furthermore, in laser processing, uniform quality of the processing can be attained. For example, in laser welding, inhomogeneities due to fluctuations of the laser power on striking the workpiece can be detected or readjusted.

An embodiment of the invention provides that, for monitoring the power of the electromagnetic beam of at least two, preferably each, optical element, actual values of the measurement device during the operation of the equipment are detected, these actual values are compared in the evaluation unit with a common reference value for all the optical elements or with the reference value allocated to the respective optical element, a quantitative deviation is determined, and is equated with a corresponding power of the electromagnetic radiation, in particular of the laser power. Preferably the actually produced laser power in the resonator is detected by a thermal absorber, and is compared with the laser power(s) detected at the optical elements. The actual value detected at each optical element can thereby be compared with the actually produced laser power, and a deviation in the emitted laser power can be determined and detected at an early time. A complete monitoring of the laser power along the whole beam path is made possible. At the same time, an increased degree of contamination on an optical element, or a beginning ageing or destruction, can be detected, since an increased absorption of radiation occurs in the optical element when there is increased contamination or the beginning of ageing or destruction, and results in a quantitatively greater change, particularly of the electrical resistance, than in the other optical elements. Thus the contaminated, aged, or partially destroyed optical element can be identified. Provided that the detected actual value exceeds a limiting value, which is preferably freely selectable and is predetermined in an evaluation unit, a signal is immediately emitted and the laser arrangement is, for example, stopped for safety, in order to prevent damage or complete destruction and to change the optical element.

The monitoring of the laser power, and of the degree of contamination, or ageing or partial destruction, can be integrated into an online process. By this means, protocols for the duration of use of the laser arrangement can also be set up and serve for the evaluation of data, such as average lifetime of an optical element, actual emitted laser power for the processing of workpieces and materials, maintenance intervals, or the like, and contribute to raising process safety and accordingly to quality assurance.

The actual values can be detected at freely selectable time intervals or constantly. The detection of the information can thereby be determined by the measuring unit in dependence on the required quality assurance and monitoring.

According to an embodiment of the invention, it is provided that a set of characteristic curves for optical elements is detected and stored in the evaluation unit. These characteristic curves are detected for each suitable support material and coating material and their combination. By comparing the actual values or their quantitative changes with the deposited characteristic curves, it is possible to give a specific statement about the present state of the optical element and the cause of changes in its state during use of the optical element in a laser arrangement.

The device according to the invention can be produced cost-effectively and makes a simplified detection of the items of information possible. A measuring unit provided in the device has at least one contact element that can be arranged on the optical element(s) of a laser arrangement that are to be monitored. The mounting and positioning of the optical element as heretofore can substantially be retained. Furthermore, the device can be retrofitted to existing laser arrangements.

It is provided that two mutually associated contact elements are provided on the optical element, remote from the beam axis of a laser beam. In this manner, an electrical resistance measurement can take place by means of a simple arrangement, without the beam path being affected. The straight line on which the two contact elements are situated intersects the beam axis of the laser beam.

According to an embodiment of the invention, it is provided that the at least one contact element is provided, releasably or fixed, on the support material or on a coating on the support material, of the optical element. For example, in the case of a releasable connection, a mechanical connection can be provided. Likewise contacts can abut under pressure on the optical element. As fixed connections, the contact elements can be adhered, soldered, welded, bonded on, or the like.

It can furthermore be provided that in a multilayer coating, conductive layers, particularly electrically conductive or dielectric layers, form a measurement plane for the arrangement of contact elements. For example, with two superposed conductive layers, the contact elements can be provided along an X-axis in the first plane and along the Y-axis in the second plane, so that a double actual value detection is made possible.

According to a further embodiment of the invention, plural contact elements are provided on an optical element and are arranged pairwise remote from each other, with the straight lines formed between the contact elements mutually parallel or at an optional angle. The surface of incidence of the laser beam on the optical element can thereby be specifically detected by means of a kind of scanning, so that the incidence surface of the laser beam can also be determined.

According to a further embodiment of the invention, wires or a grid structure is provided on or in the optical elements, and can be connected with contact elements in the outer edge region of the optical elements. Other materials suitable for resistance measurement can thereby be used that are not suitable as supporting material or coating material.

BRIEF DESCRIPTION OF THE DRAWINGS

The invention is set forth in the following drawings, in which.

DETAILED DESCRIPTION OF THE INVENTION

Figure 1:
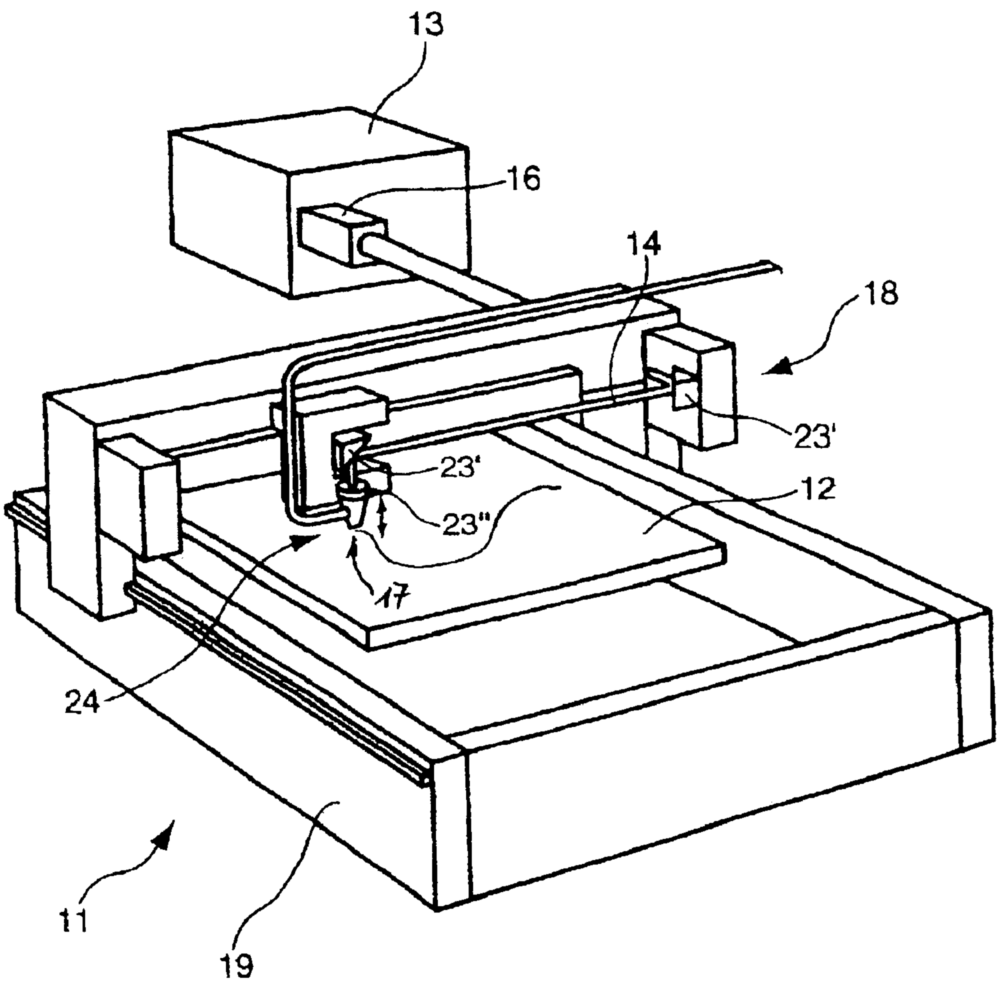
FIG. 1 shows a schematic structure of a laser processing machine.

A laser equipment 11 is shown in FIG. 1, and is used for the processing of materials and workpieces 12. The laser equipment 11 includes a laser arrangement with a laser device 13, in particular a $CO_2$ laser that produces an electromagnetic radiation, in particular a laser beam 14. The wavelength of the laser beam is preferably in the far infrared region. A beam telescope 16 is provided on the laser device 13 and couples out the laser beam 14 produced in the laser device 13. The laser beam 14 is guided by an external optics 18 from the beam telescope 16 to the processing point 17. The external optics 18 is provided on a machine base frame 19 that has one or more axes, depending on the intended use. In the present embodiment, the external optics 18 is moved in an X-, Y- and Z-direction. A single-axis or multi-axis optics is also termed a flying optics. Alternatively, the workpiece and/or the optics can also be moved.

The laser equipment 11 has numerous optical elements 23. The optical elements 23 required in the laser device 13 are termed internal optical elements, and include, for example, reflecting mirror, coupling-out mirror, deflecting mirror and partially transmitting mirror, and also transmitting optical elements such as lenses, which are not shown in detail. The external optics 18 has at least one deflecting mirror 23' for beam guiding and beam forming, and in the processing head 24 at least one further deflecting mirror 23' and a focusing optics 23" that is constituted, for example, as a lens. Instead of the further deflecting mirror 23' and the focusing optics 23", a concave mirror can also be provided. The beam path of the laser beam 14 from the beam telescope 16 to the focusing optics 23" is kept closed by a bellows.

As shown in FIGS. 2–6, these optical elements 23 have a support material 31 of metallic material, an alloy, or a semiconductor material. These optical elements 23 usually consist of copper or silicon, the support material 31 not being limited to these. A coating 32 is provided on the support material 31. This coating 32 can include different metals or metallic alloys and also semiconductor materials.

Likewise, a multilayer coating of the most diverse kind can be provided. In the embodiment according to FIGS. 2–6, for example, a support material 31 of silicon is provided, and a multilayer coating with a layer structure consisting alternately of a zinc selenide layer and a $ThF_4$ layer. Other structure and material compositions for the optical elements 23 are possible in diverse variations.

Figure 2:
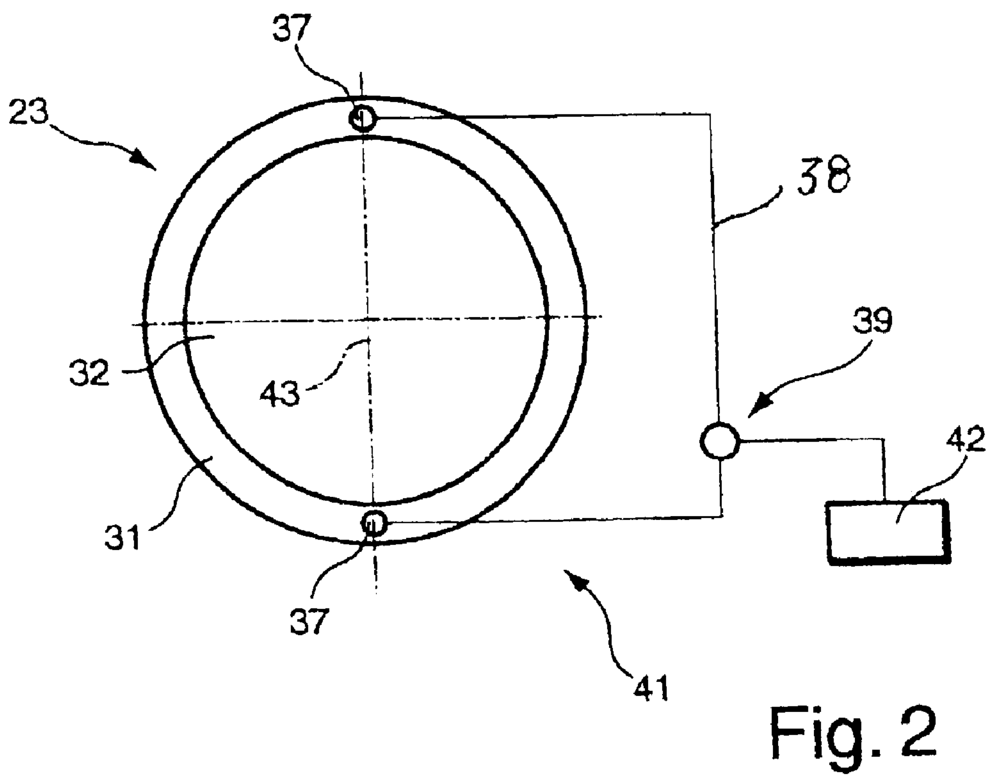
FIG. 2 shows a schematic diagram of an arrangement of contact elements on the support material of an optical element for detecting information.
Figure 3:
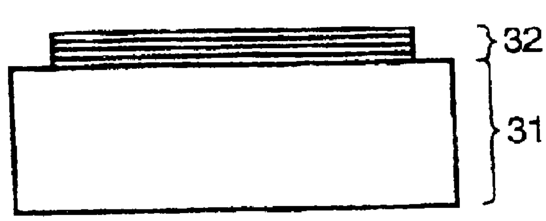
FIG. 3 shows a schematic side view of FIG. 2.

FIG. 2 schematically shows a first arrangement for detecting an electrical resistance for an optical element 23. Contact elements 37 are provided on the support material 31 and supply information via a lead 38 to a measuring device 39. The contact elements 37 are bonded to the support material 31. Alternatively, the contact elements 37 can be adhered, soldered, or mechanically clamped. Alternatively, it can also be provided that spring-loaded contact pins abut on the support material 31 with a minimum pressing force. The contact elements 37, the measuring device 39 and the lead 38 between them form the device 41 according to the invention. This device 41 can additionally have an evaluation unit 42. Alternatively, this evaluation unit 42 can also be provided in a control system of the laser equipment 11.

The measuring device 39 includes an electrical resistance that changes in dependence on the temperature based on the heat absorbed in the optical element 23 due to the laser beam. The contact elements 37 are arranged such that their connecting line 43 intersects the beam axis of the laser beam. The contact elements 37 can be arranged as shown in the edge region on the support material 31 or on the radial outer surface. It can also be provided that the coating 32 has openings to receive and arrange the contact elements 37. Alternatively, the measurement can also take place on the coating 32.

It can also be provided that one or more connecting wires are provided between the contact elements 37, and are preferably insulated with respect to the coating 32. A small change of the temperature can thereby be directly detected and determined.

Figure 4:
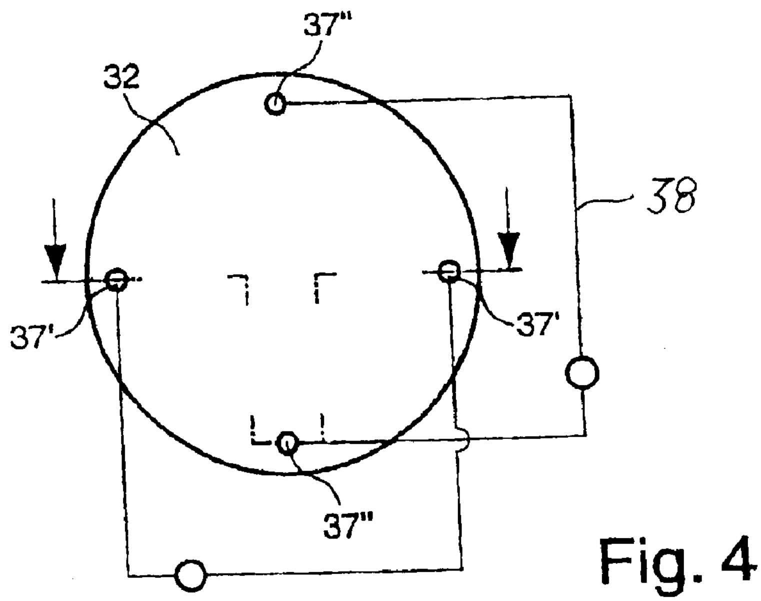
FIG. 4 shows a schematic diagram of an alternative arrangement of contact elements on a coating of the optical element for detecting information.
Figure 5:
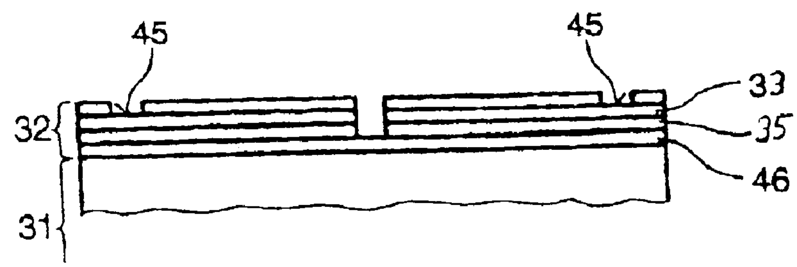
FIG. 5 shows a schematic side view of FIG. 4.

An alternative arrangement of the contact elements 37 on a coating 32 is shown in FIGS. 4 and 5. The coating 32 is shown greatly enlarged. In this arrangement, actual values are read out from different planes of the conductive layers in this arrangement. The pair of contact elements 37' is connected, for example, to the upper conductive layer 33 on the contact surfaces 45. The second pair of contact elements 37" is arranged on an electrically conductive layer 46 situated therebelow. Alternatively, the second pair of contact elements 37" can also be arranged on the support material 31. The multilayer coating is embodied such that a pair of contact elements 37', separately from a second pair of contact elements 37", is provided on respective electrically conductive layers 33, 46, which are separated-by a non-conductive layer 25. With plural conductive layers, at least one or more contact elements 37 can be provided on one or more planes.

Figure 6:
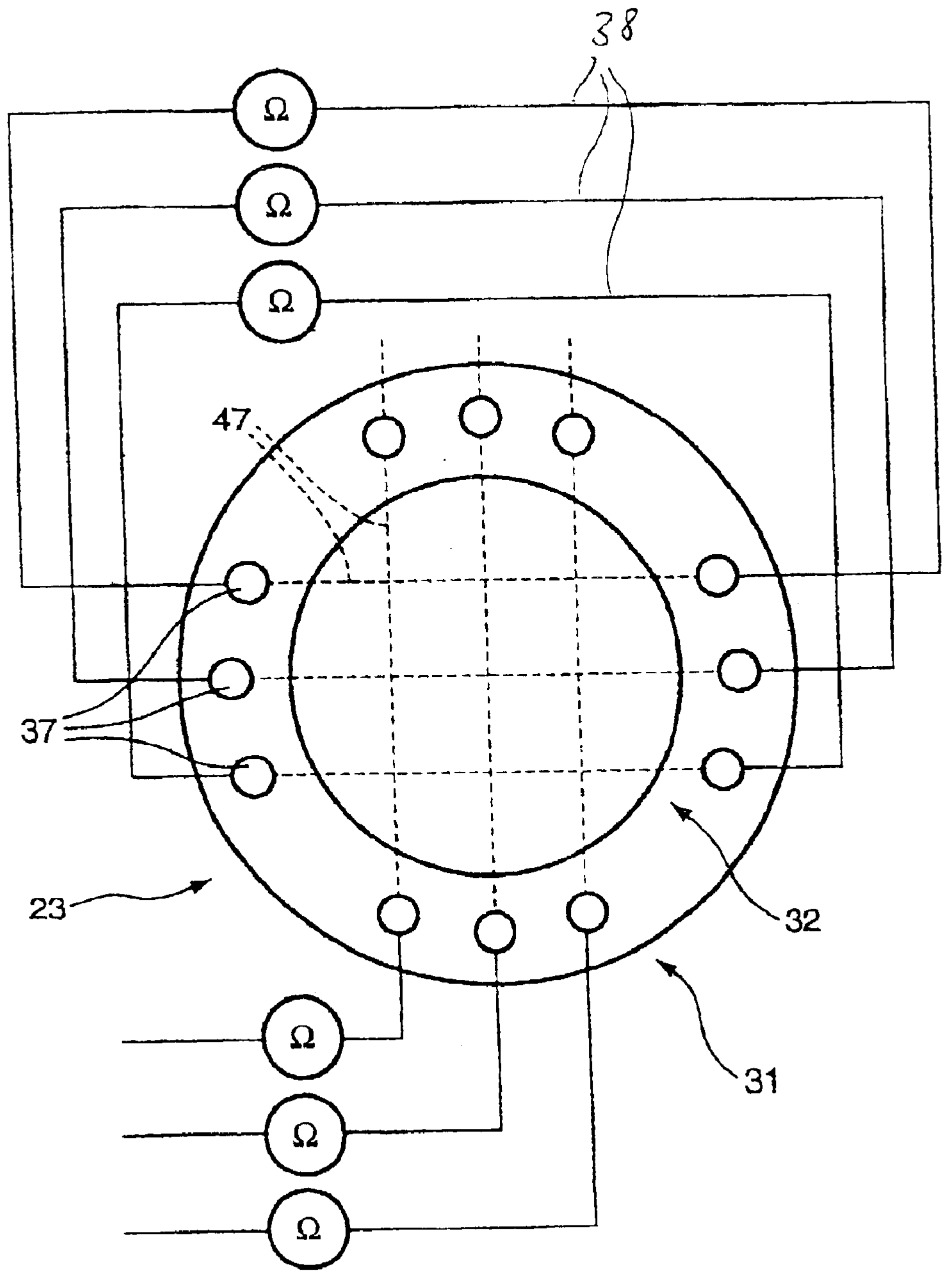
FIG. 6 shows a schematic diagram of a further alternative arrangement.

An alternative arrangement of the contact elements 37 is shown in FIG. 6. The lines 47 arranged between the pair wise mutually opposed contact elements 37 represent a schematic lattice-form division of the measurement field. Based on the individual detection, an approximated temperature course of the surface or measurement plane of the optical element 23 can thereby be detected, and the surface that the laser beam strikes can be sufficiently determined, for example.

It can be provided, alternatively to the optical elements 23 and arrangements of the contact element 37 described in the Figures, that for example a grid structure of thin conductive material is provided on or in the coating 32 or the support material 31. A change of the electrical resistance due to the temperature change can likewise be detected thereby.

Figure 7:
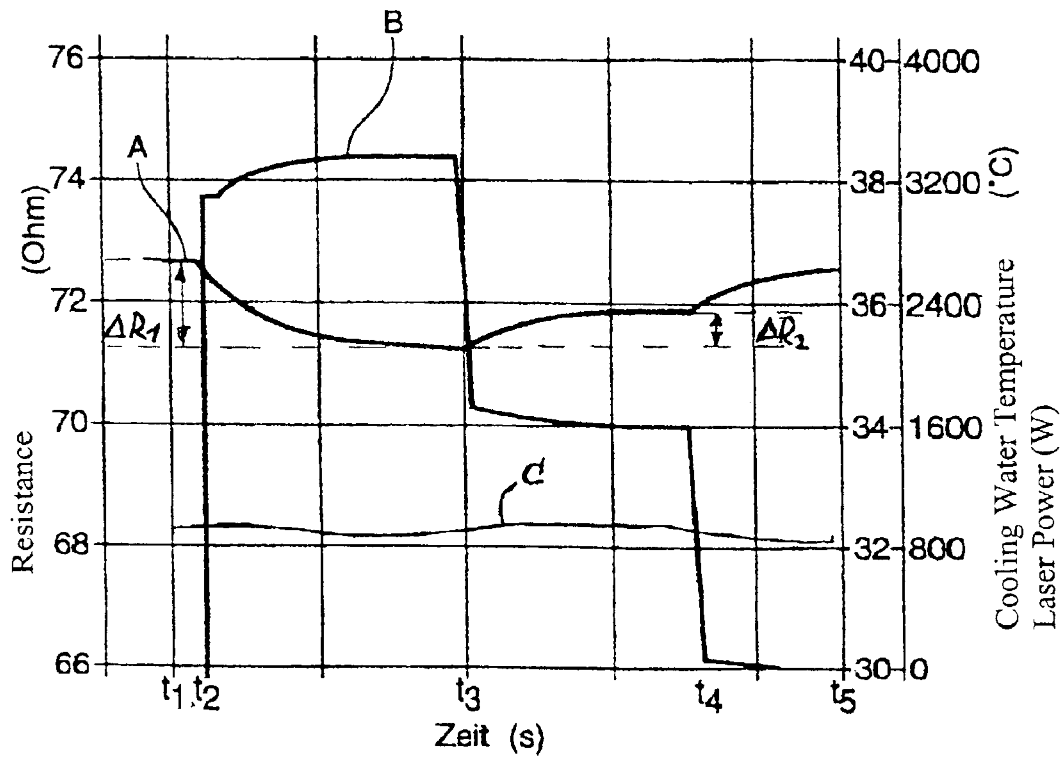
FIG. 7 shows a diagram of a measurement of an electrical resistance of an optical element when subjected to differing laser powers.

The optical element 23 shown in FIG. 2 and the device 41 according to the invention installed thereon were selected for the production of the diagram shown in FIG. 7, in order to illustrate the manner in which the laser power is related to the quantitative change in the electrical resistance. The electrical resistance of an optical element 23 which is surrounded by cooling water at a temperature of 32° according to the characteristic curve C, was determined at the time $t_1$. This value, and the further detected values of the electrical resistance, are shown by the characteristic curve A. At the time $t_2$, the optical element 23 was exposed to a laser power according to characteristic curve B of, for example, 3,400 W. After a given time, for example between 20 and 100 s, the detectable electrical resistance is nearly constant. At the time $t_3$, the electrical resistance is reduced by an amount $\Delta R_1$ with respect to the initial value or to the reference value. The laser power was then halved, so that the electrical resistance which could be detected thereupon corresponds quantitatively to the change of the laser power. The quantitative change $\Delta R_1$ was halved to $\Delta R_2$, as the characteristic curve A shows at the time $t_4$. The change of the electrical resistance is for example proportional to the change of the power in the embodiment. The relationships are in general determined in dependence on the support material 31 and the coating 32 used and also on the place where the optical element 23 is inserted.

After the optical element 23 is no longer exposed to a laser power, the determined electrical resistance returns at time $t_5$ to its initial value at time $t_1$.

Thus, the heat produced by the absorbed radiation in the optical element 23 in the embodiment is proportional to the laser power, and the quantitative change of the detected electrical resistance is a quantity which makes possible a classification relating to a beginning contamination, ageing, or destruction.

By evaluating the quantitative change of the electrical resistance at the respective optical element 23, an online monitoring for quality assurance of the laser equipment is also made possible. At the same time, by making use of this effect, an early exchange of optical elements is made possible when a given degree of contamination is present or when destruction is occurring or beginning. Furthermore, the laser equipment can be automatically switched off as soon as the laser power is detected to be outside an upper or a lower limiting value of a reference value, or as soon as the quantitative change of the resistance in an optical element exceeds a predetermined limiting value.

I claim:

1. A method for detecting information on at least one optical element for monitoring a laser arrangement, comprising the steps of:

shaping or guiding an electromagnetic radiation by the at least one optical element, detecting with a measuring device a change of at least one physical quantity in or on the at least one optical element due to the absorbed electromagnetic radiation, wherein the detecting step comprises detecting a change of an electrical resistance in the optical element by two or several pair wise opposed contact elements of the measuring device which are arranged in a connection line and outside of an electromagnetic beam on the optical element and forwarding the change of an electrical resistance in the optical element to an evaluation unit.

2. The method according claim 1, further comprising the step of comparing the at least one actual value with a reference value deposited in the evaluation unit.

3. The method according to claim 1, further comprising the step of detecting a reference value of a support material from the optical element or a coating on the optical element before mounting or before initial operation in a laser arrangement.

4. The method according to claim 1, further comprising the step of detecting the reference value and respectively the actual value on a support material of the optical element.

5. The method according to claim 1, further comprising the step of detecting the reference value and respectively the actual value on a coating on the optical element.

6. The method according to claim 1, further comprising the step of detecting the actual value with a time delay after the electromagnetic radiation first strikes the optical element.

7. The method according to claim 1, further comprising the step of detecting an operating temperature for each optical element before mounting or before initial operation in a laser arrangement.

8. The method according to claim 1, further comprising the steps of detecting the change of a power of the electromagnetic beam as a change of the physical quantity, and on exceeding or falling below an upper or lower limiting value of the power which can be selected for the reference value, emitting a signal by an evaluation unit for warning, read justment, or switching off the equipment.

9. The method according to claim 1, further comprising the step of detecting the change of the physical quantity as a change of the electrical resistance.

10. The method according to claim 1, further comprising the steps of detecting for monitoring the power of the electromagnetic beam of at least two optical elements, detecting actual values of the measuring device during the operation of the equipment, comparing these actual values in the evaluation unit with a common reference value for all the optical elements or with the reference value allocated to the respective optical element, and determining a quantitative deviation, and equating the quantitative deviation to a corresponding power of the electromagnetic beam.

11. The method according to claim 1, further comprising the steps of detecting a laser power produced in a laser resonator of the laser arrangement by a thermal absorber, and comparing the laser power with the laser power(s) detected on the optical elements.

12. The method according to claim 1, further comprising the steps of integrating the determination of the actual values into an online process and permanently detecting at one of freely selectable and established time intervals.

13. The method according to claim 1, further comprising the step of determining a set of characteristic curves for different states of the optical elements; storing this set of characteristic curves in an evaluation unit, and comparing this set of characteristics with the actual value(s) for the evaluation of the actual state of the optical elements.

14. A device for detecting information on at least one optical element in a laser arrangement, comprising a measuring device having at least two or several pair-wise opposed contact elements which are arranged in a connection line and which are provided remote from a beam axis of an electromagnetic beam on the at least one optical element for receiving an electrical resistance in the optical element.

15. The device according to claim 14, wherein at least one of the contact elements is releasably provided on one of a support material and on a coating on the support material, of the optical element.

16. The device according to claim 15, wherein the at least one contact element provided on the support material, or on a coating on the support material, of the optical element is selected from a mechanical connection, by contact elements subjected to pressure, and by adhering, soldering, welding, and bonding.

17. The device according claim 14, comprising a multilayer coating with at least one conductive layer, and at least two contact elements which are arranged to the conductive layer forming a measurement plane.

18. The device according to claim 17, wherein the at least two contact elements are provided on an electrically conductive layer.

19. The device according to claim 14, wherein a plurality of contacts are provided on an optical element, and wherein straight lines formed between the contact elements run one of parallel to one another.

20. The device according to claim 14, comprising one of conductive wires and at least one grid structure on or in the optical element, and connected, remote from the beam axis of the electromagnetic radiation, to the at least one contact element.

21. The device according to claim 14, wherein the optical elements are provided in a laser arrangement and the laser power of a laser beam, and a detector detects a change of the optical elements.

22. The device according to claim 14, wherein the optical elements are provided in a laser arrangement which includes a $CO_2$ laser.

* * * * *